(12) United States Patent
Yoshida et al.

(10) Patent No.: US 12,742,837 B2
(45) Date of Patent: Sep. 22, 2026

(54) MAGNETIC PARTICLE IMAGING DEVICE, MAGNETIC PARTICLE IMAGING METHOD, AND STORAGE MEDIUM STORING MAGNETIC PARTICLE IMAGING PROGRAM

(71) Applicant: Mitsubishi Electric Corporation, Tokyo (JP)

(72) Inventors: Keita Yoshida, Tokyo (JP); Yasuaki Susumu, Tokyo (JP); Yasuyuki Okada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 202 days.

(21) Appl. No.: 18/699,930

(22) PCT Filed: Oct. 15, 2021

(86) PCT No.: PCT/JP2021/038198
§ 371 (c)(1),
(2) Date: Apr. 10, 2024

(87) PCT Pub. No.: WO2023/062810
PCT Pub. Date: Apr. 20, 2023

(65) Prior Publication Data
US 2025/0012877 A1 Jan. 9, 2025

(51) Int. Cl.
*G01R 33/12* (2006.01)

(52) U.S. Cl.
CPC ................................ *G01R 33/1276* (2013.01)

(58) Field of Classification Search
CPC .............. G01R 33/565; G01R 33/1276; G01R 33/56509; G01R 33/563; G01R 33/48
(Continued)

(56) References Cited

U.S. PATENT DOCUMENTS 9,084,552 B2 * 7/2015 Biederer .............. A61B 5/0515
2016/0216355 A1 * 7/2016 Rahmer ........... G01R 33/56509
2017/0020407 A1 * 1/2017 Weber ................. A61B 5/7257

FOREIGN PATENT DOCUMENTS

JP 2010-172410 A 8/2010
JP 2013-096960 A 5/2013
(Continued)

OTHER PUBLICATIONS

Office Action issued May 14, 2024 in Japanese Patent Application No. 2023-553868, 6 pages.
(Continued)

*Primary Examiner* — Lee E Rodak
*Assistant Examiner* — Taqi R Nasir
(74) *Attorney, Agent, or Firm* — XSENSUS LLP

(57) ABSTRACT

An MPI device generates projection data of a magnetization change based on a position of an FFL region in a scanning direction and an angle of the FFL region in a rotation direction, generates corrected projection data by performing sensitivity correction on the projection data by using a system function previously acquired for each piece of projection data, and generates a magnetic nanoparticle image by performing image reconstruction on the corrected projection data. When generating the system function, processing circuitry makes a linear zero magnetic field generation coil form the FFL region in a structure as a subject and scan, rotate, or scan and rotate the FFL region, makes an excitation magnetic field application coil apply an excitation magnetic field to a magnetic field region, makes a detector detect the magnetization change in the structure, and generates the system function in regard to each piece of projection data.

14 Claims, 13 Drawing Sheets

(58) Field of Classification Search
USPC .......................................... 324/318, 309, 214
See application file for complete search history.

(56) References Cited

FOREIGN PATENT DOCUMENTS

| | | |
|---|---|---|
| JP | 2016-530047 A | 9/2016 |
| JP | 2021-145987 A | 9/2021 |

OTHER PUBLICATIONS

International Search Report and Written Opinion mailed on Dec. 7, 2021, received for International Application No. PCT/JP2021/038198, filed on Oct. 15, 2021, 10 pages including English Translation.

Yasutoshi Ishihara, "Improvement of the MPI image resolution by using spatial property of magnetization", Retrieved from Internet: https://kaken.nii.ac.jp/file/KAKENHI-PROJECT24300184/24300184seika.pdf, 6 pages including English Abstract.

* cited by examiner

X
Y
Z
51
30
12
11
21
R
WHEN GENERATING SYSTEM FUNCTION 1
70
STORAGE DEVICE
30
DETECTION UNIT
CONTROL UNIT
42
MEMORY
41
PROCESSOR
40
EXCITATION MAGNETIC FIELD APPLICATION UNIT
20
LINEAR ZERO MAGNETIC FIELD GENERATION UNIT
10

MEASUREMENT MPI SIGNAL

MEASUREMENT
MPI SIGNAL
Original Signal
Amp
0.0015
0.0014
0.0013
0.0012
0.0011
0
5
10
15
20
25
30
35
Scan Position[mm]
Original Signal FFT
Amp[dB]
Spatial Frequency
-2
-1
0
1
2

MEASUREMENT
MPI SIGNAL
(DC-REMOVED)
Signal without DC
g(t)
Amp
0.0004
0.0003
0.0002
0.0001
0.0000
Scan position[mm]
FFT
Signal without DC FFT
G(f)
Amp[dB]
-40
-60
-80
-100
Spatial frequency

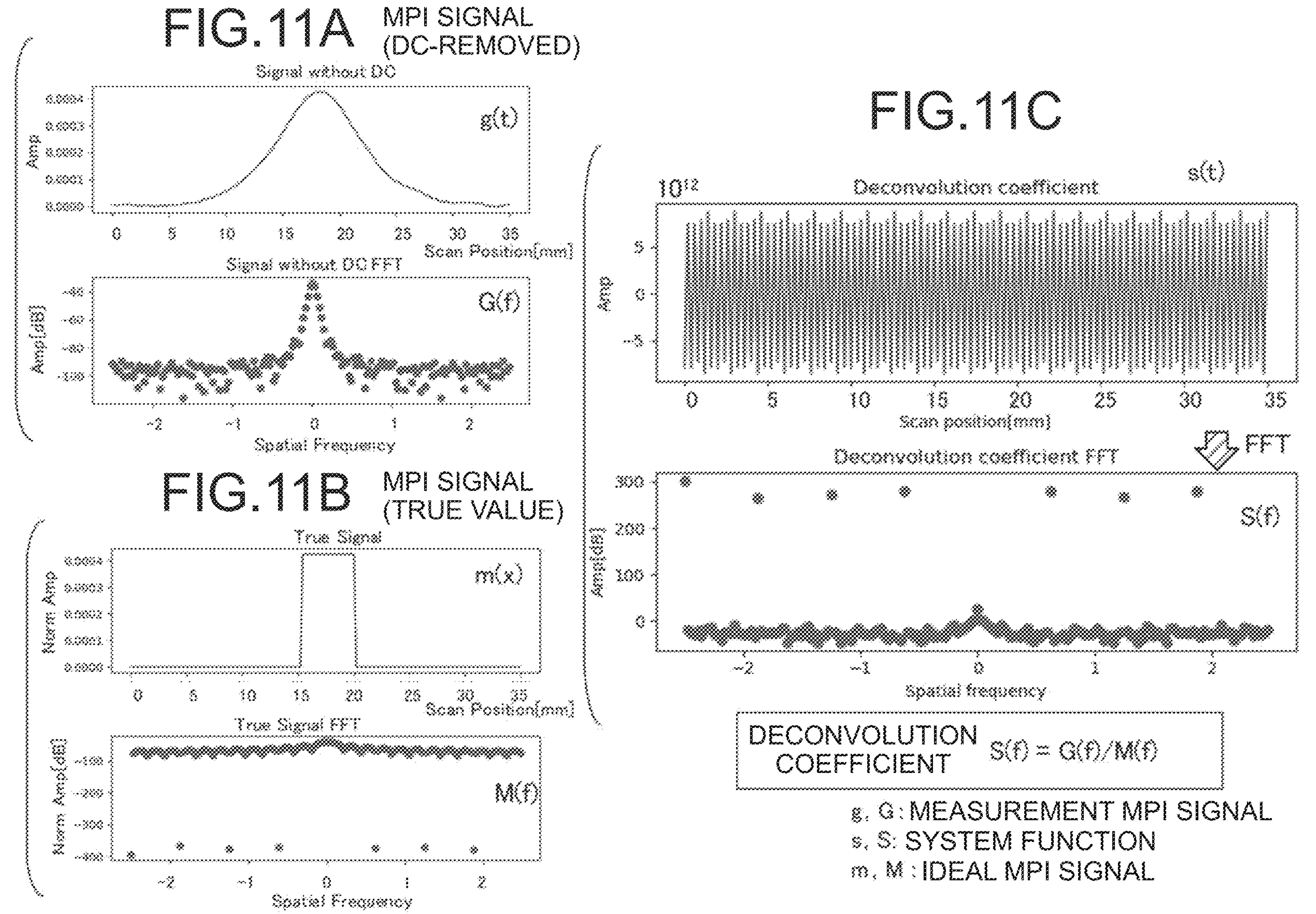
FIG.11A
MPI SIGNAL
(DC-REMOVED)
Signal without DC
g(t)
Amp
Scan Position[mm]
Signal without DC FFT
G(f)
Amp[dB]
Spatial Frequency
FIG.11B
MPI SIGNAL
(TRUE VALUE)
True Signal
m(x)
Norm Amp
Scan Position[mm]
True Signal FFT
M(f)
Norm Amp[dB]
Spatial Frequency
FIG.11C
Deconvolution coefficient
s(t)
Amp
Scan position[mm]
FFT
Deconvolution coefficient FFT
S(f)
Amp[dB]
Spatial frequency
DECONVOLUTION COEFFICIENT
S(f) = G(f)/M(f)
g, G : MEASUREMENT MPI SIGNAL
s, S: SYSTEM FUNCTION
m, M : IDEAL MPI SIGNAL

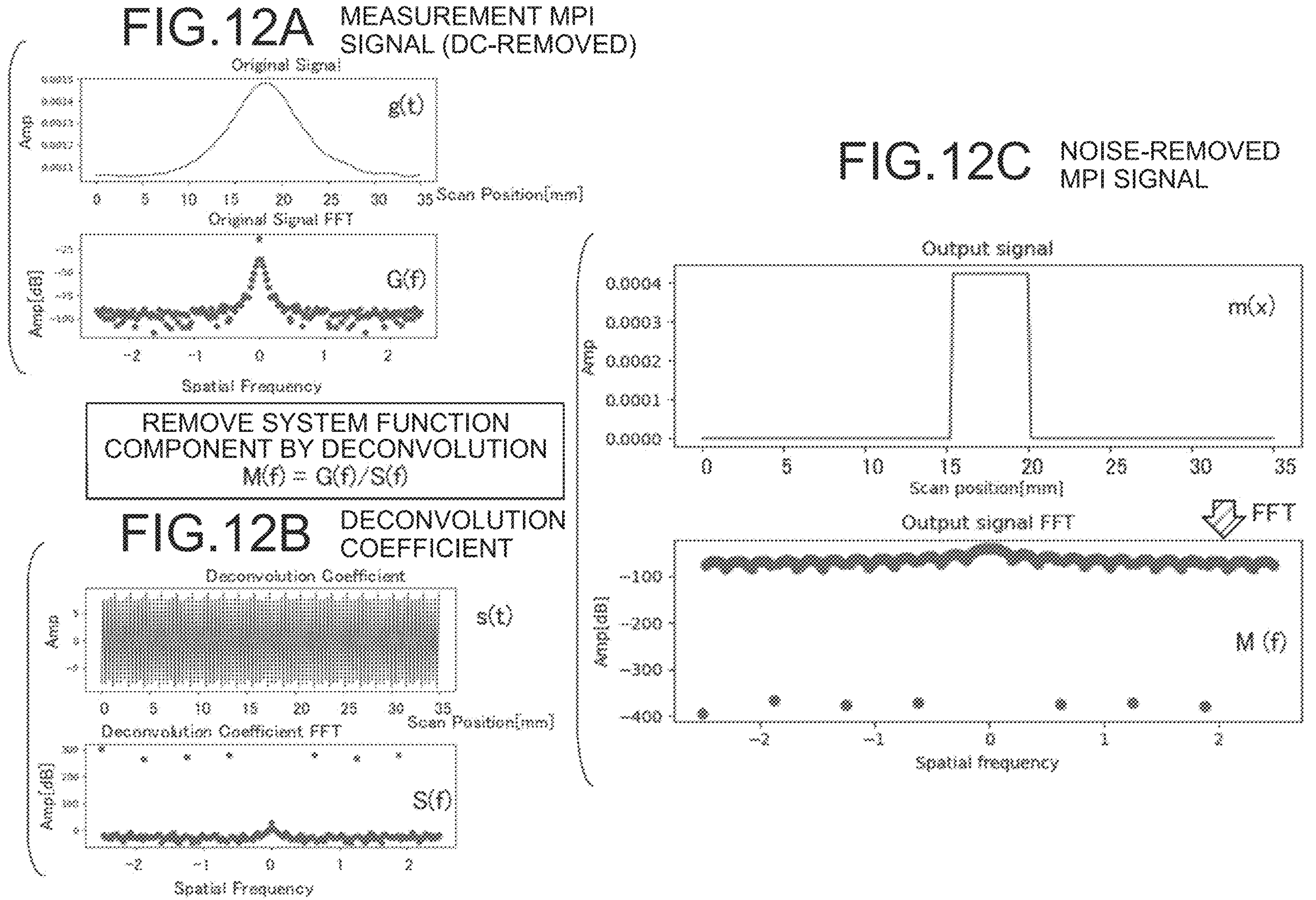
FIG.12A
MEASUREMENT MPI SIGNAL (DC-REMOVED)
Original Signal
g(t)
Amp
0 5 10 15 20 25 30 35
Scan Position[mm]
Original Signal FFT
G(f)
Amp[dB]
−2 −1 0 1 2
Spatial Frequency
REMOVE SYSTEM FUNCTION COMPONENT BY DECONVOLUTION
M(f) = G(f)/S(f)
FIG.12B
DECONVOLUTION COEFFICIENT
Deconvolution Coefficient
s(t)
Amp
0 5 10 15 20 25 30 35
Scan Position[mm]
Deconvolution Coefficient FFT
S(f)
Amp[dB]
−2 −1 0 1 2
Spatial Frequency
FIG.12C
NOISE-REMOVED MPI SIGNAL
Output signal
m(x)
Amp
0.0004
0.0003
0.0002
0.0001
0.0000
0 5 10 15 20 25 30 35
Scan position[mm]
FFT
Output signal FFT
M (f)
Amp[dB]
−100
−200
−300
−400
−2 −1 0 1 2
Spatial frequency ANGLE
CORRECTED PROJECTION DATA
EMBODIMENT
0
5
10
15
20
25
30
35
Scan Position [mm]

ANGLE
PROJECTION DATA
COMPARATIVE
EXAMPLE
0
5
10
15
20
25
30
35
Scan Position [mm]

FIG.14A 35 mm

Figures 14A, 14B:
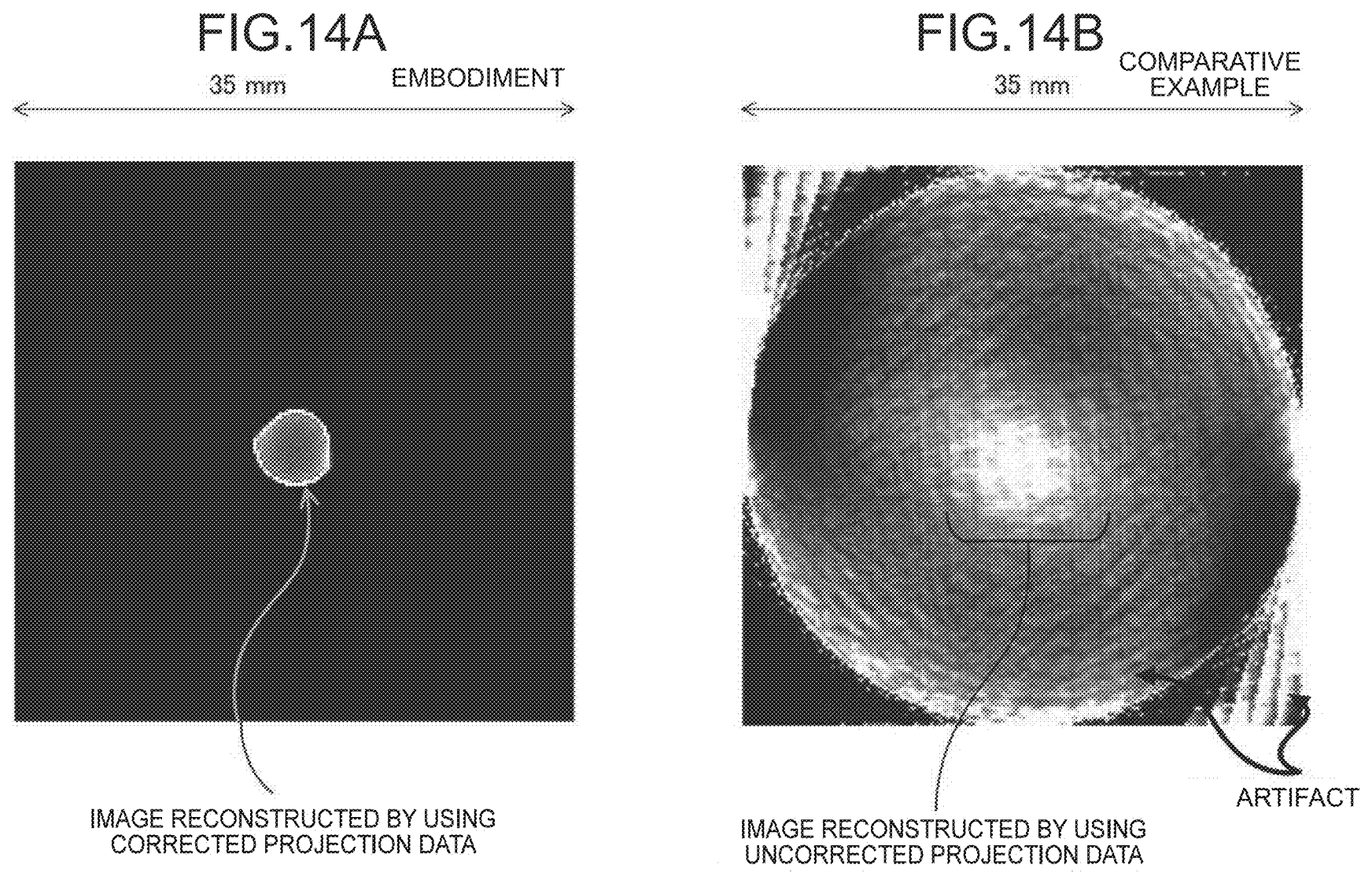

EMBODIMENT

IMAGE RECONSTRUCTED BY USING CORRECTED PROJECTION DATA

FIG.14B 35 mm

COMPARATIVE EXAMPLE

IMAGE RECONSTRUCTED BY USING UNCORRECTED PROJECTION DATA

ARTIFACT

MAGNETIC PARTICLE IMAGING DEVICE, MAGNETIC PARTICLE IMAGING METHOD, AND STORAGE MEDIUM STORING MAGNETIC PARTICLE IMAGING PROGRAM

CROSS-REFERENCE TO RELATED APPLICATION

This application is a national stage application, pursuant to 35 U.S.C. § 371, of International Patent Application No. PCT/JP2021/038198, filed Oct. 15, 2021, the entire contents of which are incorporated herein by reference.

TECHNICAL FIELD

The present disclosure relates to a magnetic particle imaging device, a magnetic particle imaging method and a magnetic particle imaging program.

BACKGROUND ART

There has been proposed a magnetic particle imaging (referred to also as "MPI") device that injects magnetic nanoparticles as a contrast medium into an image capture target and executes imaging of spatial distribution of the magnetic nanoparticles in the image capture target based on a harmonic signal deriving from a magnetization change of the magnetic nanoparticles. Patent Reference 1 discloses a magnetic particle imaging device that executes imaging of spatial distribution of magnetic nanoparticles by forming a linear zero magnetic field region by using a static magnetic field generation coil, causing a magnetization change to the magnetic nanoparticles existing in the linear zero magnetic field region, and executing a process of detecting a harmonic signal occurring at that time at each position in a scanning direction of the linear zero magnetic field region.

PRIOR ART REFERENCE

Patent Reference

Patent Reference 1: Japanese Patent Application Publication No. 2013-96960

SUMMARY OF THE INVENTION

Problem to Be Solved by the Invention

In the above-described magnetic particle imaging device, it is desirable to detect the magnetization change occurring only in the magnetic nanoparticles existing in the linear zero magnetic field region. However, in reality, the magnetization change occurs also in magnetic nanoparticles around the linear zero magnetic field region due to influence of a local magnetic field occurring in magnetic nanoparticles in the outside vicinity of (e.g., around) the linear zero magnetic field region. Therefore, a magnetic nanoparticle image with a low spatial resolution is generated.

An object of the present disclosure is to provide a magnetic particle imaging device, a magnetic particle imaging method and a magnetic particle imaging program that make it possible to generate a magnetic nanoparticle image having a high spatial resolution.

Means for Solving the Problem

A magnetic particle imaging device in the present disclosure is a device for generating a magnetic nanoparticle image indicating spatial distribution of magnetic nanoparticles in a subject, the magnetic particle imaging device including a linear zero magnetic field generation coil to generate a linear zero magnetic field region in the subject and to move the linear zero magnetic field region in a predetermined direction; an excitation magnetic field application coil to apply an AC excitation magnetic field to a magnetic field region including the linear zero magnetic field region; a detector to detect a magnetization change of the magnetic nanoparticles caused by the excitation magnetic field; and a processing circuitry.

When generating the magnetic nanoparticle image, the processing circuitry makes the linear zero magnetic field generation coil form the linear zero magnetic field region in an image capture target as the subject and scan, rotate, or scan and rotate the linear zero magnetic field region, makes the excitation magnetic field application coil apply the excitation magnetic field, makes the detector detect the magnetization change, generates projection data of the magnetization change based on a position of the linear zero magnetic field region in a scanning direction of the linear zero magnetic field region and an angle of the linear zero magnetic field region in a rotation direction of the linear zero magnetic field region, generates corrected projection data by performing sensitivity correction on the projection data by using a system function previously acquired for each piece of projection data, and generates the magnetic nanoparticle image based on the corrected projection data.

When generating the system function, the processing circuitry makes the linear zero magnetic field generation coil form the linear zero magnetic field region in a structure as the subject including the magnetic nanoparticles at a predetermined particle concentration and having a predetermined size and scan, rotate, or scan and rotate the linear zero magnetic field region, makes the excitation magnetic field application coil apply the excitation magnetic field to a magnetic field region including the linear zero magnetic field region in the structure, makes the detector detect the magnetization change in the structure, and generates the system function in regard to each piece of projection data based on the magnetization change in the structure.

A magnetic particle imaging method in the present disclosure is a method to be executed by a magnetic particle imaging device for generating a magnetic nanoparticle image indicating spatial distribution of magnetic nanoparticles in an image capture target as a subject, the magnetic particle imaging device including a linear zero magnetic field generation coil to generate a linear zero magnetic field region in a subject and to move the linear zero magnetic field region in a predetermined direction, an excitation magnetic field application coil to apply an AC excitation magnetic field to a magnetic field region including the linear zero magnetic field region, and a detector to detect a magnetization change of magnetic nanoparticles caused by the excitation magnetic field.

The magnetic particle imaging method when generating the magnetic nanoparticle image includes making the linear zero magnetic field generation coil form the linear zero magnetic field region in the image capture target and scan, rotate, or scan and rotate the linear zero magnetic field region, making the excitation magnetic field application coil apply the excitation magnetic field, making the detector detect the magnetization change, generating projection data of the magnetization change based on a position of the linear zero magnetic field region in a scanning direction of the linear zero magnetic field region and an angle of the linear zero magnetic field region in a rotation direction of the linear zero magnetic field region, generating corrected projection data by performing sensitivity correction on the projection data by using a system function previously acquired for each piece of projection data, and generating the magnetic nanoparticle image based on the corrected projection data.

The magnetic particle imaging method when generating the system function includes making the linear zero magnetic field generation coil form the linear zero magnetic field region in a structure as the subject including the magnetic nanoparticles at a predetermined particle concentration and having a predetermined size and scan, rotate, or scan and rotate the linear zero magnetic field region, making the excitation magnetic field application coil apply the excitation magnetic field to a magnetic field region including the linear zero magnetic field region in the structure, making the detector detect the magnetization change in the structure, and generating the system function in regard to each piece of projection data based on the magnetization change in the structure.

Effect of the Invention

By using the magnetic particle imaging device, the magnetic particle imaging method and the magnetic particle imaging program in the present disclosure, a magnetic nanoparticle image having a high spatial resolution can be generated.

BRIEF DESCRIPTION OF THE DRAWINGS

FIG. 11A shows the signals in FIG. 10B,

FIG. 11B shows the waveform of a measurement MPI signal as a magnetic signal detected from a cylindrical body as a reference image capture target and a signal obtained by performing the FFT process on the measurement MPI signal, and FIG. 11C shows a deconvolution coefficient calculated from FIGS. 11A and 11B and a coefficient obtained by performing the FFT process on the deconvolution coefficient.

FIG. 12A shows the signals in FIG. 10B,

FIG. 12B shows the coefficients in FIG. 11C, and

FIG. 12C shows a waveform indicating the intensity of a noise removal MPI signal as a corrected MPI signal and a signal obtained by performing the FFT process on the noise removal MPI signal.

FIG. 14A shows a magnetic nanoparticle image generated by performing image reconstruction on the corrected projection data, and FIG. 14B shows a magnetic nanoparticle image based on the uncorrected original projection data.

MODE FOR CARRYING OUT THE INVENTION

An MPI device, an MPI method and an MPI program according to an embodiment will be described below with reference to the drawings. The following embodiment is just an example and it is possible to appropriately combine embodiments and appropriately modify each embodiment.

Figure 1:
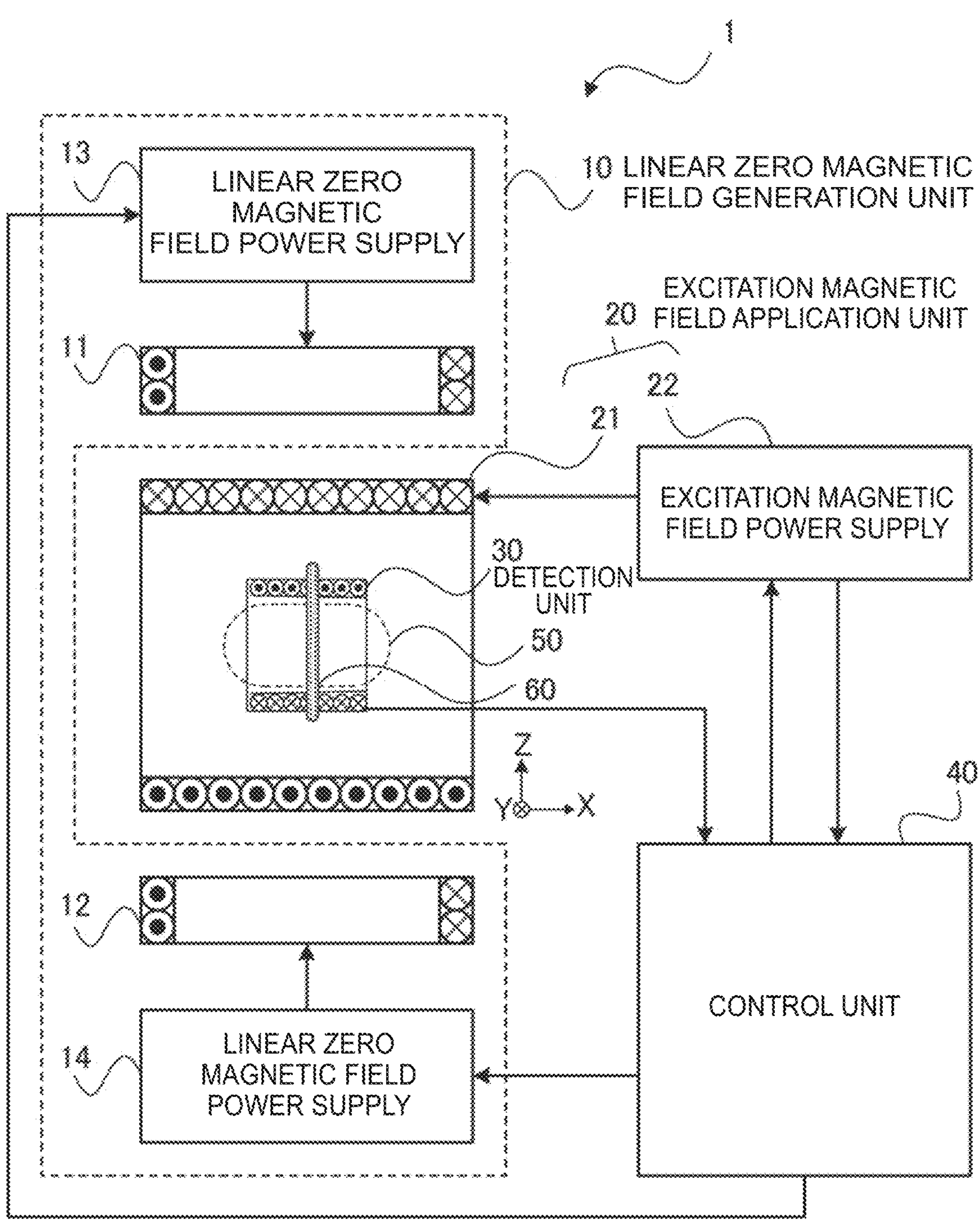
FIG. 1 is a diagram schematically showing the configuration of a magnetic particle imaging device according to an embodiment.
Figure 2:
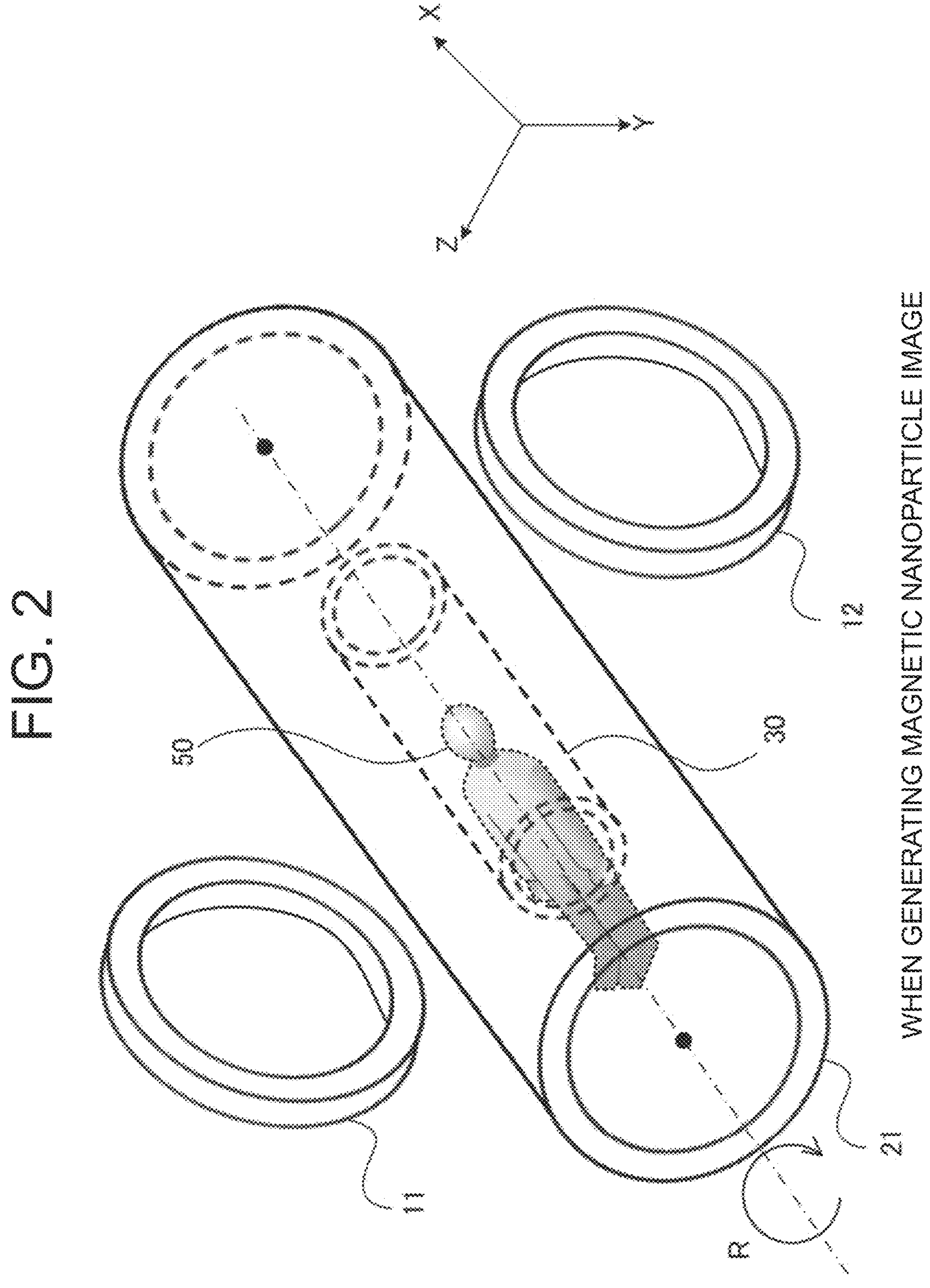
FIG. 2 is a perspective view schematically showing the structure of a principal part of the MPI device according to the embodiment and a human as an image capture target being a subject.
Figure 3:
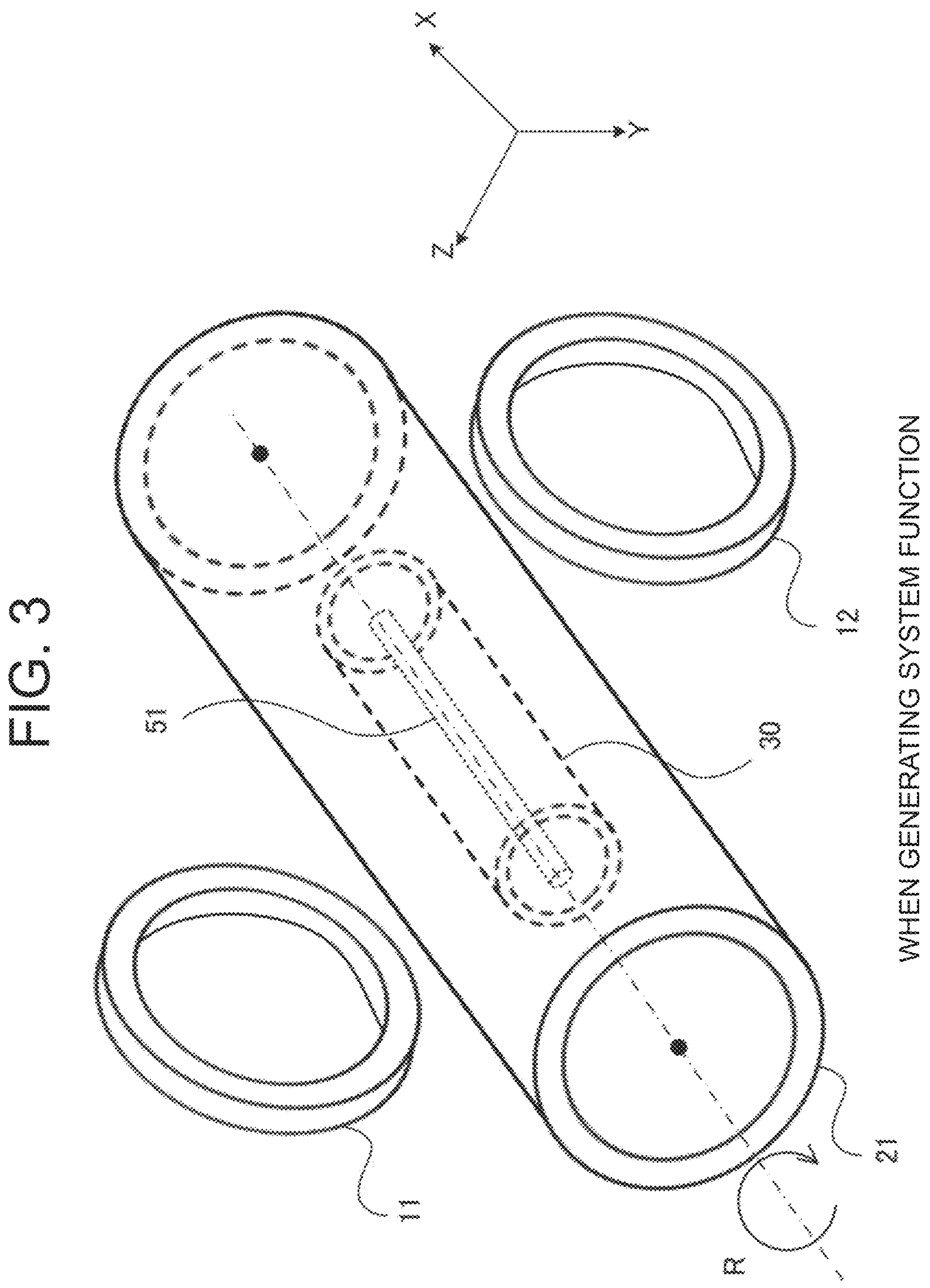
FIG. 3 is a perspective view schematically showing the structure of the principal part of the MPI device according to the embodiment and a cylindrical body as a structure.

In FIGS. 1 to 4, coordinate axes of an XYZ orthogonal coordinate system are shown in order to facilitate the understanding of relationships between drawings. A Z-axis is a coordinate axis in a lengthwise direction of a linear zero magnetic field (referred to also as a "free field line (FFL)") region. A Y-axis is a coordinate axis in a scanning direction (Y direction) of the FFL region orthogonal to the Z-axis. An X-axis is a coordinate axis in a direction orthogonal to both of the Z-axis and the Y-axis. In FIG. 2 and FIG. 3, an R direction represents a rotation direction of the FFL region. In FIG. 2 and FIG. 3, a central axis of the rotation in the rotation direction is an axis in the X direction. Incidentally, in the drawings, the same or corresponding components are assigned the same reference character.

Configuration of MPI Device

FIG. 1 is a diagram schematically showing the configuration of an MPI device 1 according to an embodiment. The MPI device 1 is a device that generates (referred to also as "reconstructs") a magnetic nanoparticle image indicating the spatial distribution of magnetic nanoparticles in an image capture target 50 as a subject. Further, the MPI device 1 is a device capable of executing an MPI method according to the embodiment. Furthermore, the MPI device 1 is a device capable of executing an MPI program according to the embodiment.

FIG. 2 is a perspective view schematically showing the structure of a principal part of the MPI device 1 and the image capture target 50. The image capture target 50 is, for example, a human into whose body magnetic nanoparticles have been administered. The image capture target 50 can also be an entity other than a human (e.g., an animal, a plant, or the like). The magnetic nanoparticles are magnetic particles containing a magnetic material and having a diameter in a nanometer range. The magnetic nanoparticles have been formed to have a nature to concentrate on an affected part (e.g., particular cells in the brain, an organ, or the like) after the administration into the human, for example. As an example of the magnetic nanoparticles, there has been known “Resovist (registered trademark)” (generic name: Ferucarbotran) as a hydrophilic colloid liquid of superparamagnetic iron oxide coated with carboxydextran.

As shown in FIG. 1, the MPI device 1 includes a linear zero magnetic field generation unit 10 that forms an FFL region 60, an excitation magnetic field application unit 20 that applies an AC excitation magnetic field, a detection unit 30 as a magnetization change detection unit that detects (i.e., measures) the magnetization change of the magnetic nanoparticles, and a control unit 40 that controls the whole of the device.

The linear zero magnetic field generation unit 10 forms the FFL region 60 in the subject and moves the FFL region 60 in a predetermined direction. For example, the linear zero magnetic field generation unit 10 forms the FFL region 60 in the subject, and scans the FFL region 60 in a predetermined scanning direction (the Y direction), or rotates the FFL region 60 in a predetermined rotation direction (the R direction), or scans the FFL region 60 in a predetermined scanning direction (the Y direction) and rotates the FFL region 60 in a predetermined rotation direction (the R direction). The linear zero magnetic field generation unit 10 includes a linear zero magnetic field generation coil 11 as a first linear zero magnetic field generation unit and a linear zero magnetic field generation coil 12 as a second linear zero magnetic field generation unit. The linear zero magnetic field generation coils 11 and 12 are respectively arranged on sides opposite to each other across the image capture target 50 as the subject. The linear zero magnetic field generation coils 11 and 12 are coils for generating a magnetic field, and electric power is supplied to the linear zero magnetic field generation coils 11 and 12 respectively by linear zero magnetic field power supplies 13 and 14.

The linear zero magnetic field generation unit 10 linearly moves the FFL region 60 in the scanning direction (e.g., the Y direction in FIGS. 1 to 3) by a predetermined travel distance each time. For example, the linear zero magnetic field generation unit 10 successively moves the position of the FFL region 60 in the scanning direction to each of a plurality of predetermined positions. The scanning direction is, for example, the Y direction orthogonal to the lengthwise direction of the FFL region 60 (Z direction). The movement of the FFL region 60 is carried out by controlling the linear zero magnetic field power supplies 13 and 14, for example. It is also possible to carry out the movement of the FFL region 60 by moving the image capture target 50, moving the linear zero magnetic field generation unit 10, or moving the image capture target 50 and the linear zero magnetic field generation unit 10.

Further, the linear zero magnetic field generation unit 10 is capable of rotating the FFL region 60 by a predetermined rotation angle each time. The linear zero magnetic field generation unit 10 rotates the FFL region 60 in the R direction parallel to a YZ plane, for example. The rotation of the FFL region 60 is carried out by controlling the linear zero magnetic field power supplies 13 and 14, for example. It is also possible to carry out the rotation of the FFL region 60 by rotating the linear zero magnetic field generation coils 11 and 12 in the R direction and the −R direction or rotating the image capture target 50 in the R direction and the −R direction.

The excitation magnetic field application unit 20 includes an excitation magnetic field generation coil 21 that applies the AC excitation magnetic field to a magnetic field region including the FFL region 60 and an excitation magnetic field power supply 22 that supplies electric power to the excitation magnetic field generation coil 21. As shown in FIG. 1 to FIG. 3, the excitation magnetic field generation coil 21 is a ring-shaped coil wound in the R direction, for example.

The detection unit 30 detects the magnetization change of the magnetic nanoparticles included in the FFL region 60 caused by the excitation magnetic field (more precisely, detects a harmonic signal caused by the magnetization change as a magnetic response signal). The detection unit 30 includes one or a plurality of magnetic field detectors (e.g., magnetic field detection coils), for example. A detection signal outputted from the detection unit 30 may be amplified by an amplifier circuit. The one or a plurality of magnetic field detectors can also be semiconductor elements (e.g., Hall elements or the like) for detecting a magnetic field.

The control unit 40 controls the operation of the whole of the MPI device 1. When generating the magnetic nanoparticle image, the control unit 40 makes the linear zero magnetic field generation unit 10 form the FFL region 60 in the image capture target 50 and scan, rotate, or scan and rotate the FFL region 60, makes the excitation magnetic field application unit 20 apply the excitation magnetic field, and makes the detection unit 30 detect the magnetization change. Further, the control unit 40 changes the position of the FFL region 60 in the scanning direction (the Y direction) and the angle of the FFL region 60 in the rotation direction R, generates projection data of the magnetization change based on the position of the FFL region 60 in the scanning direction and the angle of the FFL region 60, and generates corrected projection data by performing sensitivity correction on the projection data by using a system function previously acquired for each piece of projection data. Furthermore, the control unit 40 generates the magnetic nanoparticle image (e.g., FIG. 14A which will be explained later) based on the corrected projection data (e.g., FIG. 13A which will be explained later).

FIG. 3 is a perspective view schematically showing the structure of the principal part of the MPI device 1 according to the embodiment and a structure 51 as the subject. The structure 51 is a cylindrical body, for example. However, the structure 51 is not limited to a cylindrical body. The system function used for generating the corrected projection data is generated previously. When generating the system function, the control unit 40 makes the linear zero magnetic field generation unit 10 form the FFL region 60 in the structure 51 as a reference subject including the magnetic nanoparticles at a predetermined particle concentration and having a predetermined size and scan, rotate, or scan and rotate the FFL region 60, makes the excitation magnetic field application unit 20 apply the excitation magnetic field to a magnetic field region including the FFL region 60 in the structure 51, makes the control unit 40 detect the magnetization change in the structure 51, and generates the system function in regard to each piece of projection data based on the magnetization change in the structure 51. The system function is generated based on detection sensitivity at each position in the scanning direction and each angle in the rotation direction.

Figure 4:
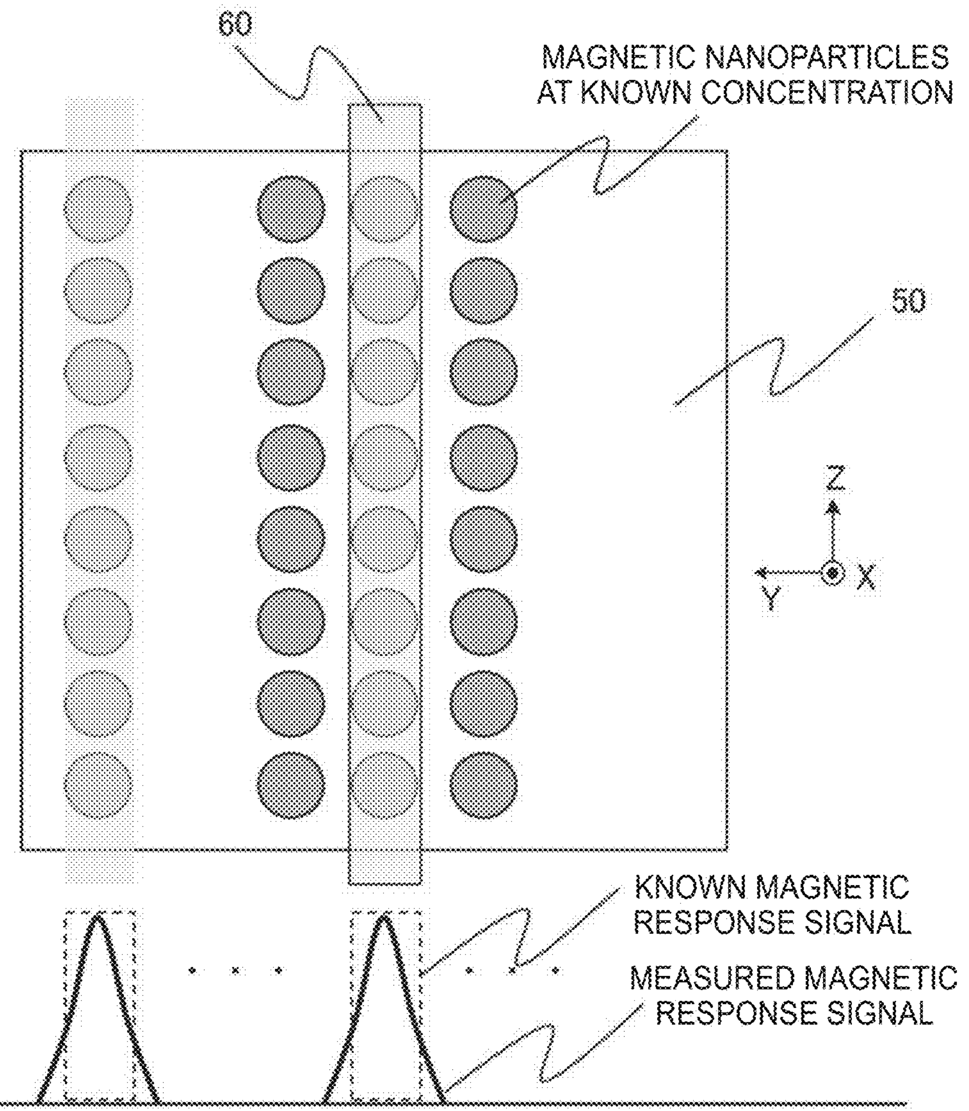
FIG. 4 is a diagram showing magnetic nanoparticles at a known concentration, a linear zero magnetic field region, a magnetic response signal as a measured magnetic signal, and a known magnetic response signal.

FIG. 4 is a diagram showing the magnetic nanoparticles at a known concentration, the FFL region 60, the measured magnetic response signal, and a known magnetic response signal. All of the 8×4 circles shown in FIG. 4 indicate the magnetic nanoparticles at the known concentration. FIG. 4 indicates that the FFL region 60 moves in the Y direction, the measured magnetic response signal is a sum total of magnetic signals that occurred in the FFL region 60 and its vicinity and has a waveform similar to a triangular waveform, and an ideal known magnetic response property (sum total of magnetic signals that occurred in the FFL region 60 alone) has a rectangular waveform indicated by broken lines. By exciting the magnetic nanoparticles having magnetization, a magnetic signal corresponding to the magnetization change (i.e., a change in the magnetization of the magnetic nanoparticles) is directly detected by the detection unit 30 from the magnetic nanoparticles in a field of view (FOV) of the detection unit 30.

Figure 5:
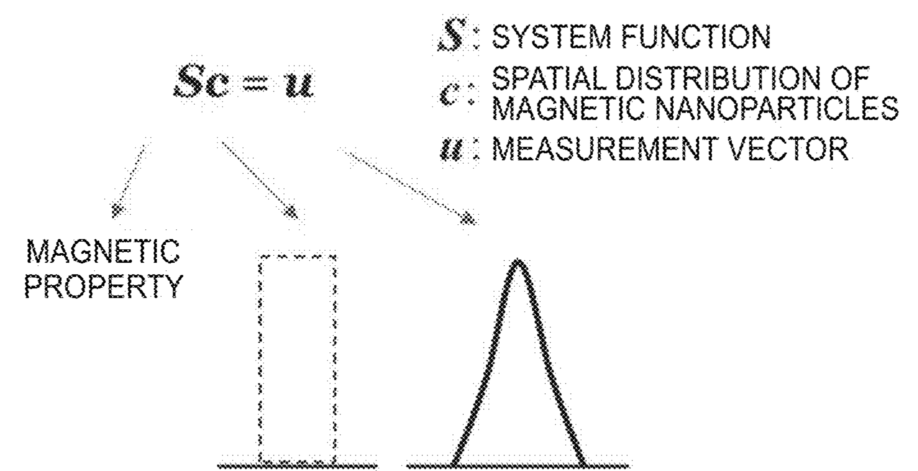
FIG. 5 is a diagram showing a relationship among a system function, a spatial distribution of the magnetic nanoparticles, and the magnetic signal (measurement vector).

FIG. 5 is a diagram showing a relationship among the system function S, the spatial distribution c of the magnetic nanoparticles in the FFL region 60, and the measured magnetic response signal u (i.e., measurement vector). As shown in FIG. 5, the measured magnetic response signal u is a signal obtained by convolving the system function S representing the detection sensitivity (i.e., magnetic property) with the spatial distribution c of the magnetic nanoparticles in the FFL region 60.

Figure 6:
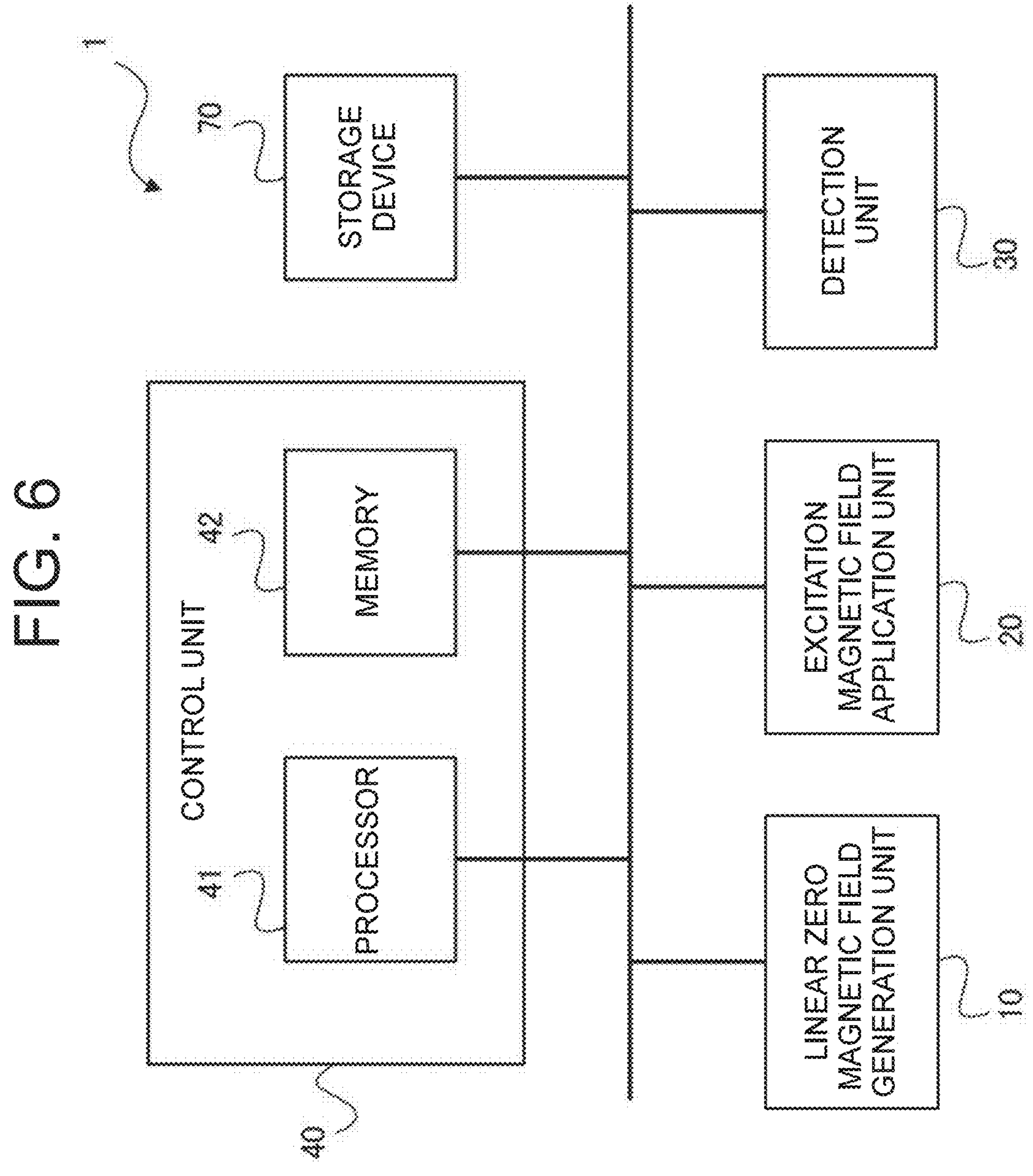
FIG. 6 is a diagram showing an example of the hardware configuration of the MPI device according to the embodiment.

FIG. 6 is a diagram showing an example of the hardware configuration of the MPI device 1 according to the embodiment. As shown in FIG. 6, the control unit 40 of the MPI device 1 includes, for example, a processor 41 such as a CPU (Central Processing Unit) and a memory 42 as a volatile storage device. The control unit 40 can be a computer. The memory 42 is a semiconductor memory such as a RAM (Random Access Memory). Further, the MPI device 1 includes a storage device 70 such as a hard disk drive (HDD) or a solid state drive (SSD). The storage device 70 can also be a part of an external device capable of communicating with the MPI device 1. For example, the storage device 70 can be a storage device of a server capable of communication via a network.

Functions of the MPI device 1 are implemented by processing circuitry. The processing circuitry can be either dedicated hardware or the processor 41 executing a program (e.g., an MPI program for executing an MPI method according to the embodiment) stored in the memory 42. The processor 41 can be any one of a processing device, an arithmetic device, a microprocessor, a microcomputer, and a DSP (Digital Signal Processor).

In the case where the processing circuitry is dedicated hardware, the processing circuitry is, for example, a single circuit, a combined circuit, a programmed processor, a parallelly programmed processor, an ASIC (Application Specific Integrated Circuit), an FPGA (Field-Programmable Gate Array) or a combination of some of these circuits.

In the case where the processing circuitry is the processor 41, the MPI program is implemented by software, firmware, or a combination of software and firmware. The software and the firmware are described as programs and stored in the memory 42. The processor 41 implements the functions of the units by reading out and executing the MPI program stored in the memory 42.

Incidentally, it is also possible to implement part of the MPI device 1 by dedicated hardware and part of the MPI device 1 by software or firmware. As above, the processing circuitry is capable of implementing the functions by hardware, software, firmware, or a combination of some of these means.

Operation When Generating Magnetic Nanoparticle Image

Next, the operation when the magnetic nanoparticle image is generated by the MPI device 1 will be described below. The operation when the magnetic nanoparticle image is generated by the MPI device 1 differs from that described in the Patent Reference 1 in executing the projection data correction process by using the system function.

Figure 7:
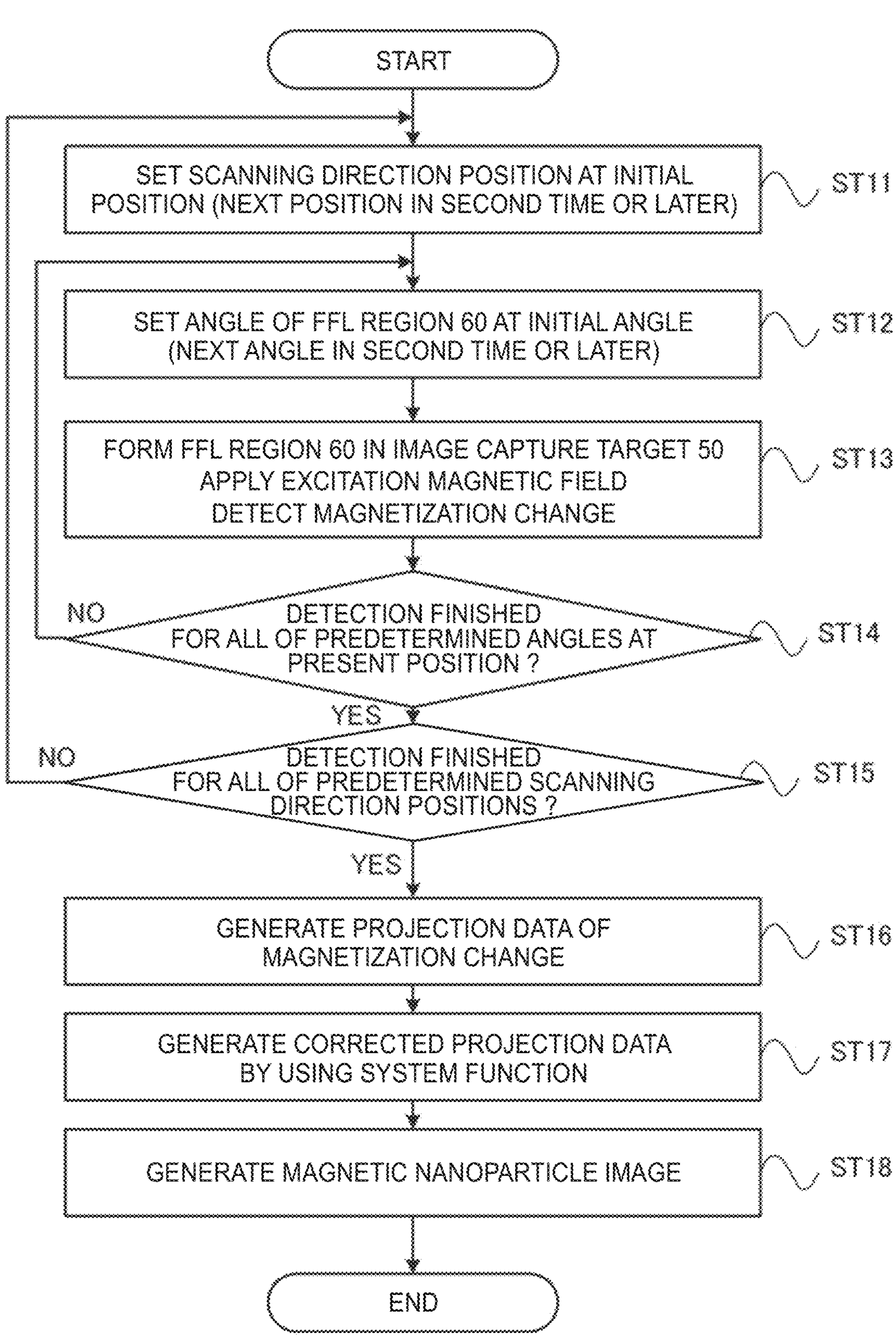
FIG. 7 is a flowchart showing an example of a magnetic nanoparticle image generation process of the MPI device according to the embodiment.

FIG. 7 is a flowchart showing an example of a magnetic nanoparticle image generation process of the MPI device 1. FIG. 7 shows an example in which the MPI device 1 changes both of the position of the FFL region 60 in the scanning direction and the angle of the FFL region 60. However, it is also possible for the MPI device 1 to change only the position of the FFL region 60 in the scanning direction or change only the angle of the FFL region 60.

First, the control unit 40 controls the linear zero magnetic field generation unit 10 and thereby forms the FFL region 60 in the image capture target 50 (shown in FIG. 2) and sets the position of the FFL region 60 in the scanning direction at an initial position (step ST11). The initial position is a predetermined position in the Y direction in FIG. 2, for example.

Subsequently, the control unit 40 controls the linear zero magnetic field generation unit 10 and thereby sets the angle of the FFL region 60 at an initial angle (step ST12). The initial angle is a predetermined angle in the R direction in FIG. 2, for example.

Subsequently, the control unit 40 controls the excitation magnetic field application unit 20 and thereby excites the magnetic nanoparticles in the FFL region 60, and makes the detection unit 30 detect the magnetization change (step ST13).

Subsequently, the control unit 40 judges whether or not the detection has been finished for all of predetermined angles of the FFL region 60 in the R direction at the present position in the scanning direction. When there remains an angle for which the detection has not been finished yet (NO in step ST14), the control unit 40 returns the process to the step ST12, sets the angle of the FFL region 60 at the next angle (i.e., one of the predetermined angles) by rotating the FFL region 60 by a constant rotation angle by controlling the linear zero magnetic field generation unit 10, and returns to the processing of the step ST14 through the processing of the step ST13. When there remains no angle for which the detection has not been finished yet at the present position in the scanning direction, that is, when the detection has been finished for all the angles (YES in the step ST14), the control unit 40 advances the process to step ST15.

In the step ST15, the control unit 40 judges whether or not the detection (i.e., the processing of the steps ST12 to ST14) has been finished for all of the plurality of predetermined positions of the FFL region 60 in the Y direction. When there remains a position for which the detection has not been finished yet (NO in step ST15), the control unit 40 returns the process to the step ST11, sets the position of the FFL region 60 at the next position (i.e., one of the plurality of predetermined positions) by moving the FFL region 60 in the Y direction by a constant distance by controlling the linear zero magnetic field generation unit 10, and returns to the processing of the step ST15 through the processing of the steps ST12 to ST14. When there remains no position for which the detection has not been finished yet, that is, when the detection has been finished for all the positions (YES in the step ST15), the control unit 40 advances the process to step ST16.

In the step ST16, the control unit 40 generates the projection data of the magnetization change based on the position and the angle of the magnetization change (e.g., a projection position and a projection angle of the projection data with respect to the detection unit 30). Here, the projection data is data obtained by executing a process of projecting detection data onto the magnetic field detector of the detection unit 30 in a direction along the FFL region 60. Thus, the projection position is a position corresponding to the position of the FFL region 60 in the scanning direction. The projection position is referred to also as a scan position. The projection angle is an angle corresponding to the rotation angle of the FFL region 60 in the R direction.

In step ST17, the control unit 40 generates the corrected projection data by selecting a system function for each projection position and each projection angle from the storage device 70 and performing the sensitivity correction on the projection data by using the selected system function. It is also possible for the control unit 40 to generate the corrected projection data by selecting a system function from the storage device 70, estimating a system function other than the selected system function by executing interpolation in regard to the position in the scanning direction, the angle of the linear zero magnetic field region in the rotation direction, or both of the position in the scanning direction and the angle by using the selected system function, and performing the sensitivity correction on the projection data by using the selected system function and the estimated system function. In this case, the number of the previously acquired system functions can be reduced.

In step ST18, the control unit 40 generates the magnetic nanoparticle image based on the corrected projection data.

Operation When Generating System Function

Figure 8:
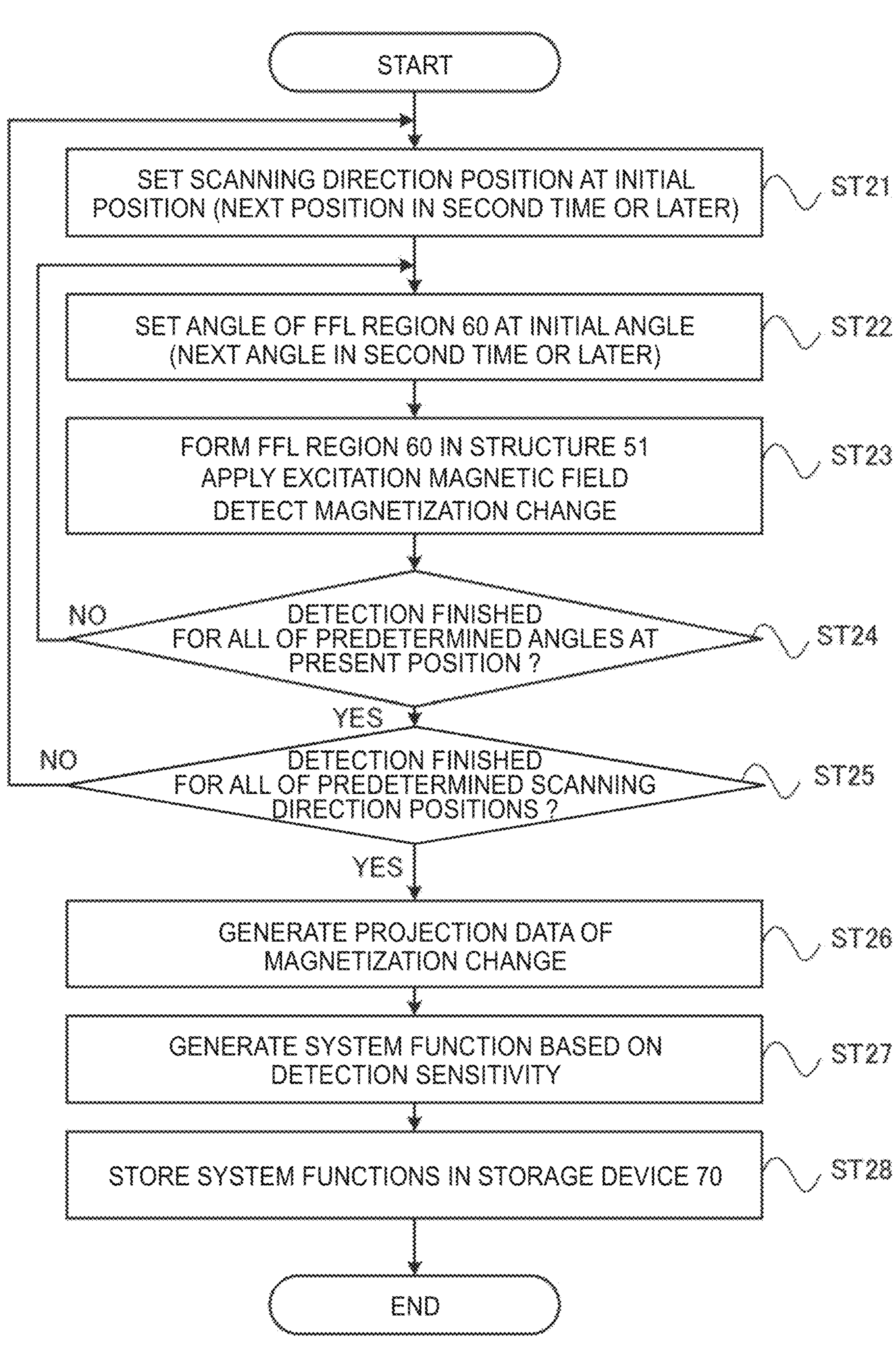
FIG. 8 is a flowchart showing an example of a system function generation process of the MPI device according to the embodiment.

FIG. 8 is a flowchart showing an example of a system function generation process of the MPI device 1. FIG. 8 shows an example in which the MPI device 1 changes both of the position of the FFL region 60 in the scanning direction and the angle of the FFL region 60. However, it is also possible for the MPI device 1 to change only the position of the FFL region 60 in the scanning direction or change only the angle of the FFL region 60.

In the generation of the system function, the control unit 40 first controls the linear zero magnetic field generation unit 10 and thereby generates the FFL region 60 in the structure 51 (FIG. 3) and sets the position of the FFL region 60 in the scanning direction at an initial position (step ST21). The initial position is a predetermined position in the Y direction in FIG. 3, for example.

Subsequently, the control unit 40 controls the linear zero magnetic field generation unit 10 and thereby sets the angle of the FFL region 60 at an initial angle (step ST22). The initial angle is a predetermined angle in the R direction in FIG. 3, for example.

Subsequently, the control unit 40 controls the excitation magnetic field application unit 20 and thereby excites the magnetic nanoparticles in the FFL region 60, and makes the detection unit 30 detect the magnetization change (step ST23).

Subsequently, the control unit 40 judges whether or not the detection has been finished for all of a plurality of predetermined angles of the FFL region 60 in the R direction at the present position in the scanning direction. When there remains an angle for which the detection has not been finished yet at the present position in the scanning direction (NO in step ST24), the control unit 40 returns the process to the step ST22, sets the angle of the FFL region 60 at the next angle (i.e., one of the plurality of predetermined angles) by rotating the FFL region 60 by a constant rotation angle by controlling the linear zero magnetic field generation unit 10, and returns to the processing of the step ST24 through the processing of the step ST23. When there remains no angle for which the detection has not been finished yet at the present position in the scanning direction, that is, when the detection has been finished for all the angles (YES in the step ST24), the control unit 40 advances the process to step ST25.

In the step ST25, the control unit 40 judges whether or not the detection (i.e., the processing of the steps ST22 to ST24) has been finished for all of the plurality of predetermined positions of the FFL region 60 in the scanning direction namely in the Y direction. When there remains a position in the scanning direction, for which the detection has not been finished yet (NO in step ST25), the control unit 40 returns the process to the step ST21, sets the position of the FFL region 60 in the scanning direction at the next position in the scanning direction (i.e., one of the plurality of predetermined positions in the scanning direction) by moving the FFL region 60 in the Y direction by a constant distance by controlling the linear zero magnetic field generation unit 10, and returns to the processing of the step ST25 through the processing of the steps ST22 to ST24. When there remains no position in the scanning direction, for which the detection has not been finished yet, that is, when the detection has been finished for all the positions in the scanning direction (YES in the step ST25), the control unit 40 advances the process to step ST26.

In the step ST26, the control unit 40 generates the projection data of the magnetization change based on the position and the angle of the magnetization change (e.g., the projection position and the projection angle of the projection data with respect to the detection unit 30).

The control unit 40 generates the system function representing the detection sensitivity at each of combinations of the position in the scanning direction and the angle in step ST27, and stores a system function set including a plurality of system functions in the storage device 70 in step ST28.

Process of Generating Image from Projection Data

A process of generating a reconstruction image from the projection data will be described below with reference to FIGS. 9A and 9B to FIGS. 14A and 14B.

Figure 9B:
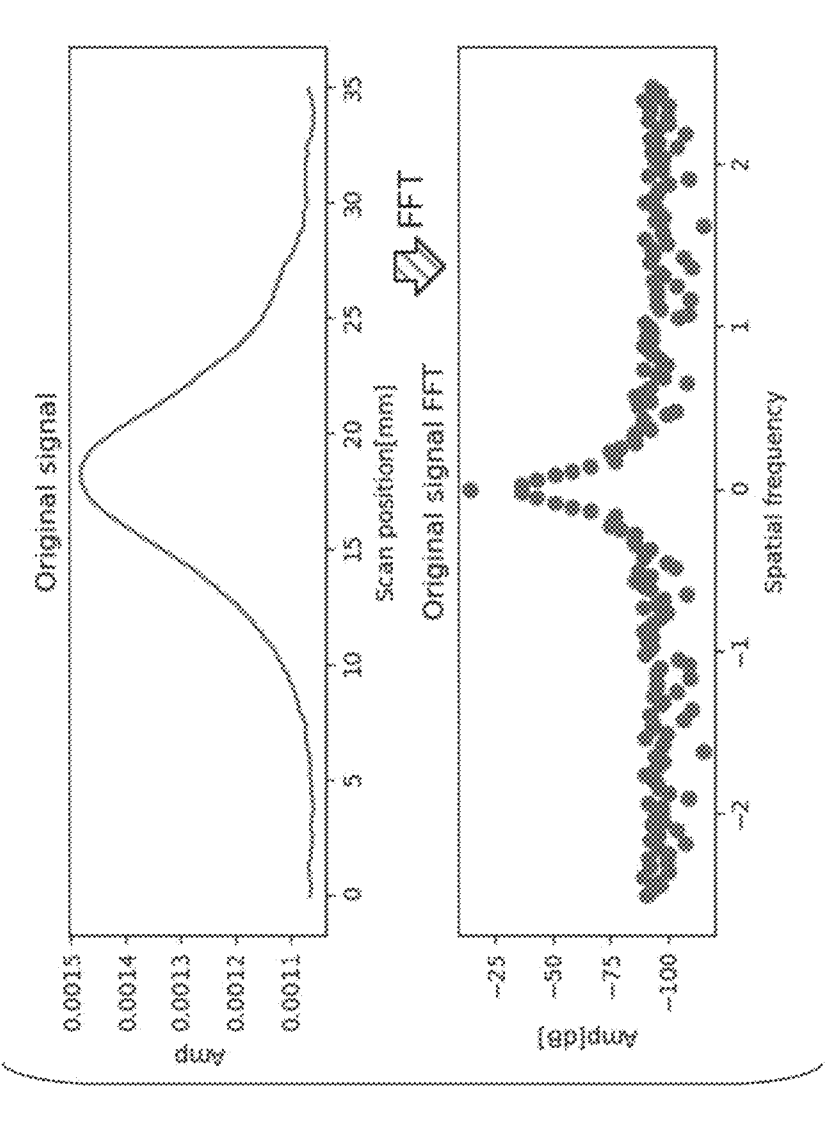
FIG. 9B shows a waveform indicating intensity of a measurement MPI signal at a certain angle and a signal obtained by performing a fast Fourier transform (FFT) process on the measurement MPI signal.
Figure 9A:
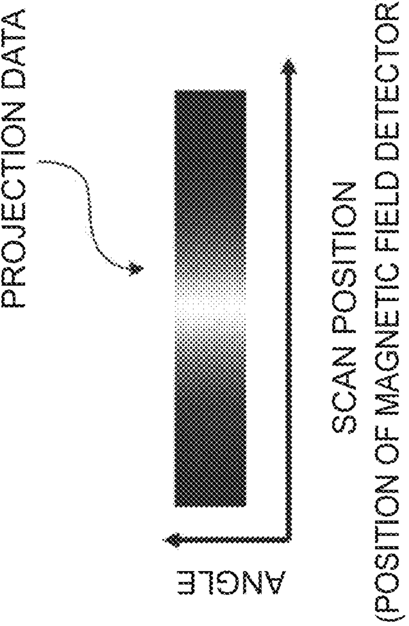
FIG. 9A shows an example of projection data projected on scan position-angle coordinates.

First, the control unit 40 extracts MPI signals at a plurality of angles from the projection data. The plurality of angles are angles in the rotation direction represented by R, for example. FIG. 9A shows an example of the projection data projected on scan position-angle coordinates. The scan positions correspond to positions of a plurality of magnetic field detectors (or detection elements) of the detection unit 30. In FIG. 9A, intensity of a measurement MPI signal as the measured magnetic response signal is higher, that is, amplitude of the measurement MPI signal is higher, in brighter parts. FIG. 9B shows a waveform (Original Signal) indicating the intensity of the measurement MPI signal at a certain angle in FIG. 9A and a signal (Original Signal FFT) obtained by performing a fast Fourier transform (FFT) process on the measurement MPI signal.

Figures 10A, 10B:
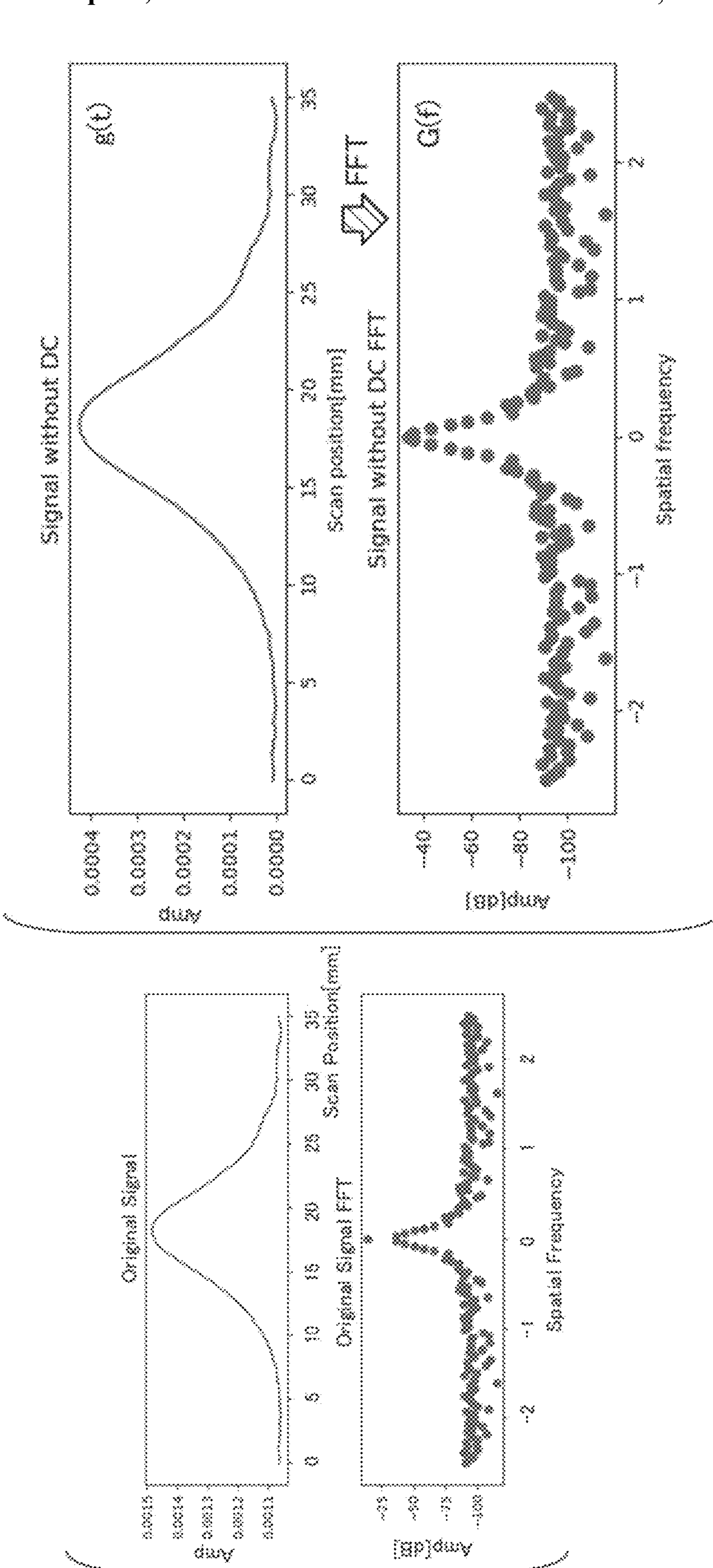
FIG. 10A shows the signals in FIG. 9B.
FIG. 10B shows a waveform indicating the intensity of the signal obtained by removing a DC component from the measurement MPI signal in FIG. 10A and a signal obtained by performing the FFT process on the measurement MPI signal after the removal of the DC component.

Subsequently, the control unit 40 removes a DC component from the signals in FIG. 9B. FIG. 10A shows the signals in FIG. 9B. FIG. 10B shows a waveform (Signal without DC) indicating the intensity of the signal obtained by removing the DC component from the measurement MPI signal in FIG. 10A and a signal (Signal without DC FFT) obtained by performing the FFT process on the measurement MPI signal after the removal of the DC component.

Subsequently, the control unit 40 calculates a deconvolution coefficient S(f) as the system function from the signals in FIG. 10B and an ideal MPI signal. FIG. 11A shows the signals in FIG. 10B. FIG. 11B shows the waveform of the ideal MPI signal m(x) as a magnetic signal detected from the cylindrical body as the reference structure 51 and a signal M(f) obtained by performing the FFT process on the ideal MPI signal. FIG. 11C shows a deconvolution coefficient s(t) calculated from FIGS. 11A and 11B and S(f) as a deconvolution coefficient FFT obtained by performing the FFT process on the deconvolution coefficient s(t). Here, f represents the frequency, t represents the time, and x represents the position in the scanning direction (or the position of the magnetic field detector).

Subsequently, the control unit 40 calculates m(x) as a noise removal MPI signal and M(f) as the signal obtained by performing the Fourier transform on the signal m(x) from the signals in FIG. 10B and the deconvolution coefficient (i.e., the system function) in FIG. 10C. FIG. 12A shows the signals in FIG. 10B. FIG. 12B shows the deconvolution coefficient in FIG. 11C. FIG. 12C shows a waveform indicating the intensity of m(x) as the noise removal MPI signal as the corrected MPI signal and M(f) as the signal obtained by performing the FFT process on the noise removal MPI signal.

By the process shown in FIGS. 9A and 9B to FIGS. 12A to 12C, the noise-removed MPI signal shown in FIG. 12C can be generated from the signal based on the original projection data shown in FIG. 9B.

Effect of Embodiment

Figures 13A, 13B:
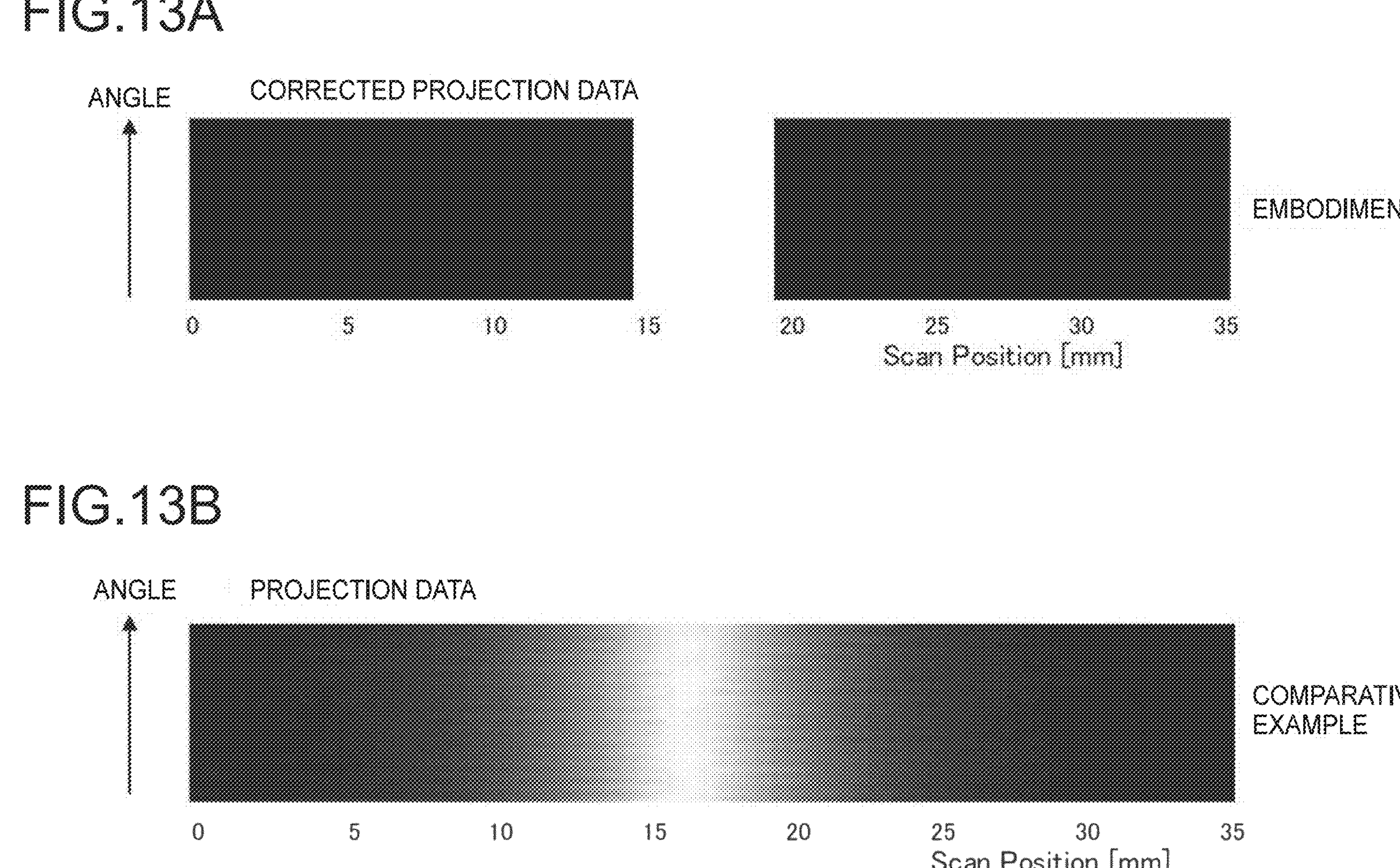
FIG. 13A shows corrected projection data.
FIG. 13B shows uncorrected original projection data.

FIG. 13A shows the corrected projection data generated by the control unit 40 of the MPI device 1 according to the embodiment. FIG. 13B shows the uncorrected original projection data (comparative example). As shown in FIG. 13A, in the corrected projection data generated by the control unit 40 of the MPI device 1 according to the embodiment, a boundary between a range in which magnetic nanoparticles exist (white region) and a range in which no magnetic nanoparticles exist (black region) is in a distinct linear shape. As above, by using the MPI device 1 according to the embodiment, a magnetic nanoparticle image having a high spatial resolution can be generated.

FIG. 14A shows a magnetic nanoparticle image generated by the MPI device 1 according to the embodiment by performing image reconstruction on the corrected projection data. FIG. 14B shows a magnetic nanoparticle image (comparative example) based on the uncorrected original projection data. As shown in FIG. 14B, if the image reconstruction is executed by using the uncorrected projection data, the boundary between the range in which magnetic nanoparticles exist (white region) and the range in which no magnetic nanoparticles exist (black region) becomes indistinct. Incidentally, the large outside circle in FIG. 14B is an artifact. In contrast, as shown in FIG. 14A, with the corrected projection data generated by the MPI device 1 according to the embodiment, the boundary between the range in which magnetic nanoparticles exist (white region) and the range in which no magnetic nanoparticles exist (black region) is in a distinct circular shape. As above, by using the MPI device 1 according to the embodiment, a magnetic nanoparticle image having a high spatial resolution can be generated.

DESCRIPTION OF REFERENCE CHARACTERS

1: MPI device, 10: linear zero magnetic field generation unit, 11, 12: linear zero magnetic field generation coil, 13, 14: linear zero magnetic field power supply, 20: excitation magnetic field application unit, 21: excitation magnetic field generation coil, 22: excitation magnetic field power supply, 30: detection unit, 40: control unit, 50: image capture target (subject), 51: structure (subject), 60: FFL region, 70: storage device, R: rotation direction.

What is claimed is:

1. A magnetic particle imaging device for generating a magnetic nanoparticle image indicating spatial distribution of magnetic nanoparticles in a subject, the magnetic particle imaging device comprising:

a linear zero magnetic field generation coil to generate a linear zero magnetic field region in the subject and to move the linear zero magnetic field region in a predetermined direction;

an excitation magnetic field application coil to apply an AC excitation magnetic field to a magnetic field region including the linear zero magnetic field region;

a detector to detect a magnetization change of the magnetic nanoparticles caused by the excitation magnetic field; and processing circuitry, wherein when generating the magnetic nanoparticle image, the processing circuitry makes the linear zero magnetic field generation coil form the linear zero magnetic field region in an image capture target as the subject and scan, rotate, or scan and rotate the linear zero magnetic field region, makes the excitation magnetic field application coil apply the excitation magnetic field, makes the detector detect the magnetization change, generates projection data of the magnetization change based on a position of the linear zero magnetic field region in a scanning direction of the linear zero magnetic field region and an angle of the linear zero magnetic field region in a rotation direction of the linear zero magnetic field region, generates corrected projection data by performing sensitivity correction on the projection data by using a system function previously acquired for each piece of projection data, wherein the system function is a deconvolution coefficient, and generates the magnetic nanoparticle image based on the corrected projection data, and when generating the system function, the processing circuitry makes the linear zero magnetic field generation coil form the linear zero magnetic field region in a structure as the subject including the magnetic nanoparticles at a predetermined particle concentration and having a predetermined size and scan, rotate, or scan and rotate the linear zero magnetic field region, makes the excitation magnetic field application coil apply the excitation magnetic field to a magnetic field region including the linear zero magnetic field region in the structure, makes the detector detect the magnetization change in the structure, and generates the system function in regard to each piece of projection data based on the magnetization change in the structure, wherein when generating the system function, the processing circuitry generates the system function representing detection sensitivity at each of combinations of the position and the angle and stores a system function set including a plurality of the system functions in a storage device, and wherein when generating the magnetic nanoparticle image, the processing circuitry generates the corrected projection data by selecting the system function from the storage device, estimating a system function other than the selected system function by executing interpolation by using the selected system function, and performing the sensitivity correction on the projection data by using the selected system function and the estimated system function.

2. The magnetic particle imaging device according to claim 1, wherein in the scanning, the linear zero magnetic field generation coil linearly moves the linear zero magnetic field region in the scanning direction by a predetermined travel distance each time.

3. The magnetic particle imaging device according to claim 1, wherein the scanning direction is a direction orthogonal to a lengthwise direction of the linear zero magnetic field region.

4. The magnetic particle imaging device according to claim 1, wherein in the rotation, the linear zero magnetic field generation coil rotates the linear zero magnetic field region by a predetermined rotation angle each time.

5. The magnetic particle imaging device according to claim 1, wherein when generating the magnetic nanoparticle image, the processing circuitry generates the corrected projection data by selecting the system function from the storage device and performing the sensitivity correction on the projection data by using the selected system function.

6. The magnetic particle imaging device according to claim 1, further comprising the storage device to store the system function set.

7. The magnetic particle imaging device according to claim 1, wherein the deconvolution coefficient is a measurement magnetic particle imaging signal divided by an ideal magnetic particle imaging signal.

8. The magnetic particle imaging device according to claim 1, wherein when generating the system function, the processing circuitry generates the system function representing detection sensitivity at each of combinations of the position and the angle.

9. A magnetic particle imaging method to be executed by a magnetic particle imaging device for generating a magnetic nanoparticle image indicating spatial distribution of magnetic nanoparticles in an image capture target as a subject, the magnetic particle imaging device including a linear zero magnetic field generation coil to generate a linear zero magnetic field region in the subject and to move the linear zero magnetic field region in a predetermined direction, an excitation magnetic field application coil to apply an AC excitation magnetic field to a magnetic field region including the linear zero magnetic field region, and a detector to detect a magnetization change of magnetic nanoparticles caused by the excitation magnetic field, wherein the magnetic particle imaging method when generating the magnetic nanoparticle image includes:

making the linear zero magnetic field generation coil form the linear zero magnetic field region in the image capture target and scan, rotate, or scan and rotate the linear zero magnetic field region;

making the excitation magnetic field application coil apply the excitation magnetic field;

making the detector detect the magnetization change;

generating projection data of the magnetization change based on a position of the linear zero magnetic field region in a scanning direction of the linear zero magnetic field region and an angle of the linear zero magnetic field region in a rotation direction of the linear zero magnetic field region;

generating corrected projection data by performing sensitivity correction on the projection data by using a system function previously acquired for each piece of projection data, wherein the system function is a deconvolution coefficient; and generating the magnetic nanoparticle image based on the corrected projection data, and the magnetic particle imaging method when generating the system function includes:

making the linear zero magnetic field generation coil form the linear zero magnetic field region in a structure as the subject including the magnetic nanoparticles at a predetermined particle concentration and having a predetermined size and scan, rotate, or scan and rotate the linear zero magnetic field region;

making the excitation magnetic field application coil apply the excitation magnetic field to a magnetic field region including the linear zero magnetic field region in the structure;

making the detector detect the magnetization change in the structure; and generating the system function in regard to each piece of projection data based on the magnetization change in the structure, wherein when generating the system function, generating the system function representing detection sensitivity at each of combinations of the position and the angle and stores a system function set including a plurality of the system functions in a storage device, and wherein when generating the magnetic nanoparticle image, generating the corrected projection data by selecting the system function from the storage device, estimating a system function other than the selected system function by executing interpolation by using the selected system function, and performing the sensitivity correction on the projection data by using the selected system function and the estimated system function.

10. The magnetic particle imaging method according to claim 9, wherein the deconvolution coefficient is a measurement magnetic particle imaging signal divided by an ideal magnetic particle imaging signal.

11. The magnetic particle imaging method according to claim 9, wherein when generating the system function, generating the system function representing detection sensitivity at each of combinations of the position and the angle.

12. A non-transitory computer-readable storage medium storing magnetic particle imaging program to be executed by a magnetic particle imaging device for generating a magnetic nanoparticle image indicating spatial distribution of magnetic nanoparticles in an image capture target as a subject, the magnetic particle imaging device including a linear zero magnetic field generation coil to generate a linear zero magnetic field region in the subject and to move the linear zero magnetic field region in a predetermined direction, an excitation magnetic field application coil to apply an AC excitation magnetic field to a magnetic field region including the linear zero magnetic field region, and a detector to detect a magnetization change of magnetic nanoparticles caused by the excitation magnetic field, wherein when generating the magnetic nanoparticle image, the magnetic particle imaging program causes the magnetic particle imaging device to execute:

making the linear zero magnetic field generation coil form the linear zero magnetic field region in the image capture target and scan, rotate, or scan and rotate the linear zero magnetic field region;

making the excitation magnetic field application coil apply the excitation magnetic field;

making the detector detect the magnetization change;

generating projection data of the magnetization change based on a position of the linear zero magnetic field region in a scanning direction of the linear zero magnetic field region and an angle of the linear zero magnetic field region in a rotation direction of the linear zero magnetic field region;

generating corrected projection data by performing sensitivity correction on the projection data by using a system function previously acquired for each piece of projection data, wherein the system function is a deconvolution coefficient; and generating the magnetic nanoparticle image based on the corrected projection data, and when generating the system function, the magnetic particle imaging program causes the magnetic particle imaging device to execute:

making the linear zero magnetic field generation coil form the linear zero magnetic field region in a structure as the subject including the magnetic nanoparticles at a predetermined particle concentration and having a predetermined size and scan, rotate, or scan and rotate the linear zero magnetic field region;

making the excitation magnetic field application coil apply the excitation magnetic field to a magnetic field region including the linear zero magnetic field region in the structure;

making the detector detect the magnetization change in the structure; and generating the system function in regard to each piece of projection data based on the magnetization change in the structure, wherein when generating the system function, generating the system function representing detection sensitivity at each of combinations of the position and the angle and stores a system function set including a plurality of the system functions in a storage device, and wherein when generating the magnetic nanoparticle image, generating the corrected projection data by selecting the system function from the storage device, estimating a system function other than the selected system function by executing interpolation by using the selected system function, and performing the sensitivity correction on the projection data by using the selected system function and the estimated system function.

13. The non-transitory computer-readable storage medium according to claim 10, wherein the deconvolution coefficient is a measurement magnetic particle imaging signal divided by an ideal magnetic particle imaging signal.

14. The non-transitory computer-readable storage medium according to claim 12, wherein when generating the system function, generating the system function representing detection sensitivity at each of combinations of the position and the angle.

* * * * *